(12) United States Patent
Kang et al.

(10) Patent No.: US 8,288,216 B2
(45) Date of Patent: Oct. 16, 2012

(54) THIN FILM TRANSISTOR AND METHOD OF FABRICATING THE SAME

(75) Inventors: Jin-Hee Kang, Yongin (KR); Chun-Gi You, Yongin (KR); Sun Park, Yongin (KR); Jong-Hyun Park, Yongin (KR); Yul-Kyu Lee, Yongin (KR)

(73) Assignee: Samsung Mobile Display Co., Ltd. (KR)

( * ) Notice: Subject to any disclaimer, the term of this patent is extended or adjusted under 35 U.S.C. 154(b) by 197 days.

(21) Appl. No.: 12/753,732

(22) Filed: Apr. 2, 2010

(65) Prior Publication Data

US 2011/0084276 A1 Apr. 14, 2011

(30) Foreign Application Priority Data

Oct. 13, 2009 (KR) .................... 10-2009-0097434

(51) Int. Cl.
*H01L 21/00* (2006.01)
(52) U.S. Cl. ......... 438/166; 438/151; 438/158; 438/164
(58) Field of Classification Search .................. 438/164, 438/166, 151, 158
See application file for complete search history.

(56) References Cited

U.S. PATENT DOCUMENTS 6,107,640 A 8/2000 Park et al.
2007/0087490 A1* 4/2007 Seo et al. ...................... 438/158
2009/0212288 A1* 8/2009 Kim et al. ....................... 257/57
2010/0123138 A1* 5/2010 Choi et al. ...................... 257/72

FOREIGN PATENT DOCUMENTS

| KR | 1998-0012071 | 4/1998 |
|----|--------------|--------|
| KR | 10-2005-003496 | 1/2005 |
| KR | 10 2005-0113036 A | 12/2005 |
| KR | 10 2006-0015183 A | 2/2006 |
| KR | 10-2006-122120 | 11/2006 |
| KR | 10 2009-0017127 A | 2/2009 |
| KR | 10 2009-0035431 A | 4/2009 |

* cited by examiner

*Primary Examiner* — Ha Tran T Nguyen
*Assistant Examiner* — Aaron Dehne
(74) *Attorney, Agent, or Firm* — Knobbe Martens Olson & Bear LLP (57) ABSTRACT

A thin film transistor (TFT) and a method of fabricating the same are disclosed. The TFT includes a substrate, a gate electrode disposed over the substrate, a gate insulating layer disposed over the gate electrode, a semiconductor layer disposed over the gate insulating layer and including a polycrystalline silicon (poly-Si) layer, an ohmic contact layer disposed over a predetermined region of the semiconductor layer, an insulating interlayer disposed over substantially an entire surface of the substrate including the ohmic contact layer, and source and drain electrodes electrically connected to the ohmic contact layer through contact holes formed in the interlayer insulating layer. A barrier layer is interposed between the semiconductor layer and the ohmic contact layer. Thus, when an off-current of a bottom-gate-type TFT is controlled, degradation of characteristics due to a leakage current may be prevented using a simple process.

20 Claims, 5 Drawing Sheets

THIN FILM TRANSISTOR AND METHOD OF FABRICATING THE SAME

CROSS-REFERENCE TO RELATED APPLICATION

This application claims the benefit of Korean Patent Application No. 2009-97434, filed Oct. 13, 2009, the disclosure of which is hereby incorporated herein by reference in its entirety.

BACKGROUND

1. Field

Non-limiting example embodiments of the present invention relate to a bottom-gate-type thin film transistor (TFT) and, more particularly, to a TFT including a polycrystalline semiconductor layer and a method of fabricating the same.

2. Related Technology

In general, fabrication of a thin film transistor (TFT) used for a display device may involve depositing an amorphous silicon (a-Si) layer on a transparent substrate formed of glass or quartz, dehydrogenating the a-Si layer, implanting impurity ions to form a channel, and crystallizing the a-Si layer to form a semiconductor layer.

Crystallization of the a-Si layer into a poly-Si layer may be performed using solid phase crystallization (SPC), excimer laser crystallization (ELC), metal induced crystallization (MIC), or metal induced lateral crystallization (MILC). Specifically, SPC typically includes annealing an a-Si layer for several to several tens of hours at temperatures below 700° C. at which a glass substrate used for a TFT of a display device is deformed. ELA typically includes partially heating an a-Si layer to a high temperature in a short amount of time by irradiating excimer laser beams to the a-Si layer. MIC typically includes bringing a metal, such as nickel (Ni), palladium (Pd), gold (Au), or aluminum (Al), into contact with an a-Si layer or injecting the metal into the a-Si layer to induce phase transition from the a-Si layer to a poly-Si layer. Also, MILC typically includes sequentially inducing the crystallization of an a-Si layer while laterally diffusing silicide formed by reaction of a metal with silicon.

Figure 1A:
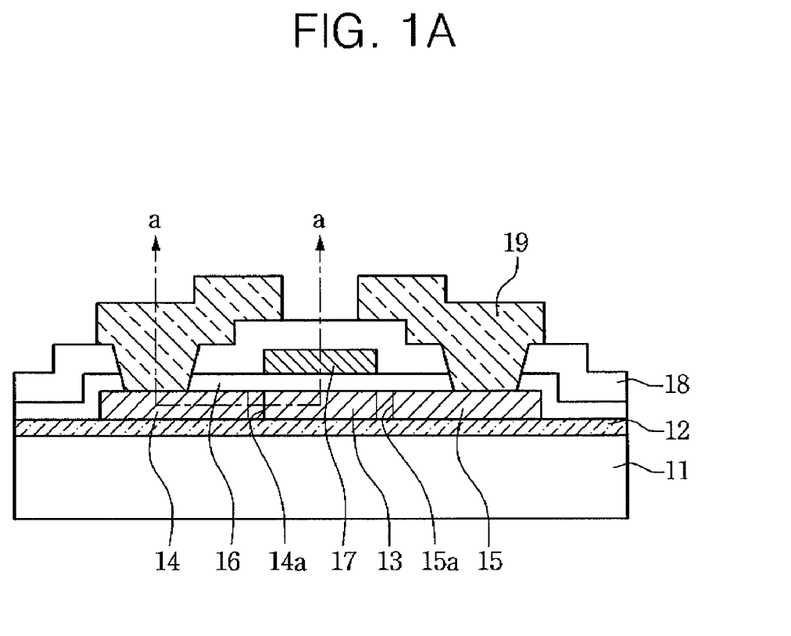
FIGS. 1A and 1B are cross-sectional views of a conventional thin film transistor (TFT)
Figure 1B:
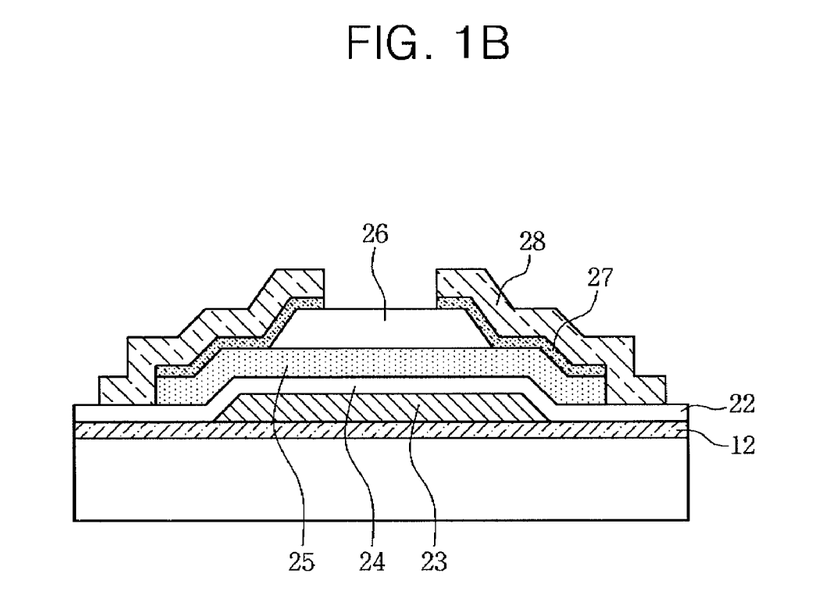

FIGS. 1A and 1B are cross-sectional views of a conventional TFT.

Initially, FIG. 1A is a cross-sectional view of a top-gate-type TFT. Referring to FIG. 1A, a buffer layer 12 for preventing diffusion of gases or moisture may be formed on an insulating substrate 11, such as a glass substrate or a plastic substrate, and an a-Si layer may be formed on the buffer layer.

Thereafter, the a-Si layer may be crystallized into a poly-Si layer using one of the above-described crystallization methods and patterned, thereby forming a semiconductor layer. A gate insulating layer 16 may be formed using a single or multiple layer of a silicon oxide layer or a silicon nitride layer.

In this case, the semiconductor layer may include a channel region 13 and source and drain regions 14 and 15, and lightly doped regions 14a and 15a may be formed between the channel region 13 and the source and drain regions 14 and 15, respectively.

Thereafter, a gate electrode 17 may be formed of a conductive material on the substrate 11, and an interlayer 18, which may be an insulating layer, may be formed of an insulating layer.

Afterwards, predetermined regions of the interlayer 18 and the gate insulating layer 16 may be etched to form contact holes exposing predetermined regions of the semiconductor layer. Source and drain electrodes 19 may be formed, thereby completing fabrication of the top-gate-type TFT.

Next, FIG. 1B is a cross-sectional view of a bottom-gate-type TFT. Referring to FIG. 1B, a buffer layer 22 may be formed on an insulating substrate 21, such as a glass substrate or a plastic substrate, and a metal material may be formed on substantially an entire surface of the substrate 21 and patterned, thereby forming a gate electrode 23.

Thereafter, a gate insulating layer 24 may be formed using a single or multiple layer of a silicon oxide layer or a silicon nitride layer on substantially an entire surface of the substrate 21.

Thereafter, an a-Si layer may be deposited on substantially an entire surface of the substrate 21 and patterned, thereby forming an a-Si layer pattern 25.

Afterwards, an insulating layer may be formed on substantially an entire surface of the substrate 21 and patterned to form an etch stopper 26 on a channel region of the a-Si layer pattern 25.

Thereafter, a heavily doped a-Si layer may be formed on substantially an entire surface of the substrate 21 and patterned using a photoresist pattern and the etch stopper 26, thereby forming a heavily doped a-Si layer pattern 27 defining source and drain regions.

Subsequently, a conductive metal may be deposited on substantially an entire surface of the substrate 21 and patterned using the photoresist pattern and the etch stopper 26 to form source and drain electrodes 28. Thus, fabrication of the bottom-gate-type TFT may be completed.

The above-described top-gate-type TFT may have a high on/off speed and high electron mobility because the semiconductor layer may be formed using the poly-Si layer obtained using one of various crystallization methods. However, the top-gate-type TFT must undergo a complicated fabrication process, and an interface between the gate insulating layer 16 and the semiconductor layer may be exposed and easily contaminated or damaged.

Conversely, the bottom-gate-type TFT may be fabricated using a simple process and an interface between the gate insulating layer 24 and the channel region may not be exposed. However, since the bottom-gate-type TFT may preclude crystallization of an a-Si layer, a channel region may be formed using the a-Si layer, thereby degrading an operating speed and electron mobility.

Meanwhile, as can be seen from the top-gate-type TFT, a lightly doped drain (LDD) region may be formed to control a leakage current. However, when the LDD region is formed by doping impurities, it is difficult to control an impurity doping process so that the uniformity of the LDD region may be degraded and additional photolithography and doping processes may be required.

Furthermore, in the bottom-gate-type TFT, the etch stopper 26 may be formed to a greater width than the gate electrode 23 (not shown) to form an offset region for controlling a leakage current. In this case, however, when an off-current is controlled, degradation of characteristics due to the leakage current cannot be radically solved, and neither the leakage current nor processes can be effectively controlled.

SUMMARY

Non-limiting example embodiments of the invention provide a thin film transistor (TFT) having a crystallized channel region to obtain both the advantages of a top-gate-type TFT and a bottom-gate-type TFT and a method of fabricating the TFT.

Also, non-limiting example embodiments of the invention provide a bottom-gate-type TFT, which may prevent degradation of characteristics due to a leakage current when an off-current is controlled using a simple process, and a method of fabricating the bottom-gate-type TFT.

According to a non-limiting example embodiment of the invention, a TFT includes: a substrate; a gate electrode disposed over the substrate; a gate insulating layer disposed over the gate electrode; a semiconductor layer disposed over the gate insulating layer and including a polycrystalline silicon (poly-Si) layer; an ohmic contact layer disposed over a predetermined region of the semiconductor layer; an interlayer disposed over substantially an entire surface of the substrate including the ohmic contact layer; and source and drain electrodes electrically connected to the ohmic contact layer through contact holes formed in the interlayer layer. A barrier layer may be interposed between the semiconductor layer and the ohmic contact layer.

The barrier layer may include an undoped amorphous silicon (a-Si) layer.

The ohmic contact layer may contain heavily doped Si.

The TFT may further include an etch stopper disposed over a predetermined region of the semiconductor layer to define a channel region.

The etch stopper may be a portion of a capping layer.

The barrier layer may be formed to correspond to the ohmic contact layer.

According to another non-limiting example embodiment of the invention, a method of fabricating a TFT includes: forming a gate electrode on a substrate; forming a gate insulating layer on the gate electrode; forming an a-Si layer on the gate insulating layer; crystallizing at least a portion of the a-Si layer into a poly-Si layer to form a semiconductor layer; forming a barrier layer and an ohmic contact layer on a predetermined region of the semiconductor layer; forming an interlayer on substantially an entire surface of the substrate having the ohmic contact layer and forming contact holes exposing predetermined regions of the ohmic contact layer in the interlayer; and forming source and drain electrodes through the contact holes of the interlayer to be electrically connected to the exposed ohmic contact layer.

The crystallization of at least a portion of the a-Si layer into the poly-Si layer may include: forming a capping layer on the a-Si layer; forming a metal catalyst layer on the capping layer; and annealing the substrate to crystallize at least a portion of the a-Si layer into the poly-Si layer.

After crystallizing the a-Si layer into the poly-Si layer, the method may further include patterning the capping layer to form an etch stopper.

The formation of the barrier layer and the ohmic contact layer on the predetermined region of the poly-Si layer may include: forming a barrier material and an ohmic contact material on substantially an entire surface of the substrate having the etch stopper; and etching the substrate having the barrier material and the ohmic contact material at one time using the etch stopper as a mask.

The barrier layer may be formed using a low-pressure chemical vapor deposition (LPCVD) process, an atmospheric pressure CVD (APCVD) process, a plasma-enhanced CVD (PECVD) process, a sputtering process, or a vacuum evaporation process.

BRIEF DESCRIPTION OF THE DRAWINGS

The above and other features will be described in reference to certain non-limiting example embodiments thereof with reference to the attached drawings in which.

DETAILED DESCRIPTION

Various non-limiting example embodiments will now be described more fully hereinafter with reference to the accompanying drawings. However, the non-limiting example embodiments described may be in different forms and should not be construed as limited to the non-limiting example embodiments set forth herein.

Non-limiting example embodiments of the invention will be described more fully hereinafter with reference to the accompanying drawings. This invention may, however, be embodied in many different forms and should not be construed as being limited to the non-limiting example embodiments set forth herein.

Non-limiting example embodiments of the invention will be described more fully hereinafter with reference to the accompanying drawings. In the drawings, the thicknesses of layers and regions are exaggerated for clarity. The same reference numerals are used to denote the same elements throughout the specification.

FIGS. 2A through 2G are cross-sectional views illustrating a method of fabricating a thin film transistor (TFT) according to a non-limiting example embodiment of the invention.

Figure 2A:
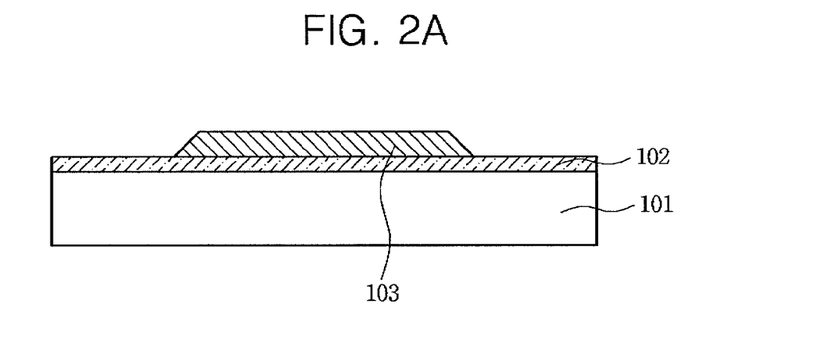
FIGS. 2A through 2G are cross-sectional views illustrating a process of fabricating a TFT according to a non-limiting example embodiment of the present invention.

Initially, referring to FIG. 2A, a buffer layer 102 may be formed on a transparent insulating substrate 101, such as a glass substrate or a plastic substrate. A gate electrode material may be formed on the buffer layer 102 and patterned, thereby forming a gate electrode 103. In this case, the buffer layer 102 may function to prevent diffusion of moisture or impurities generated in the underlying substrate 101.

Figure 2B:
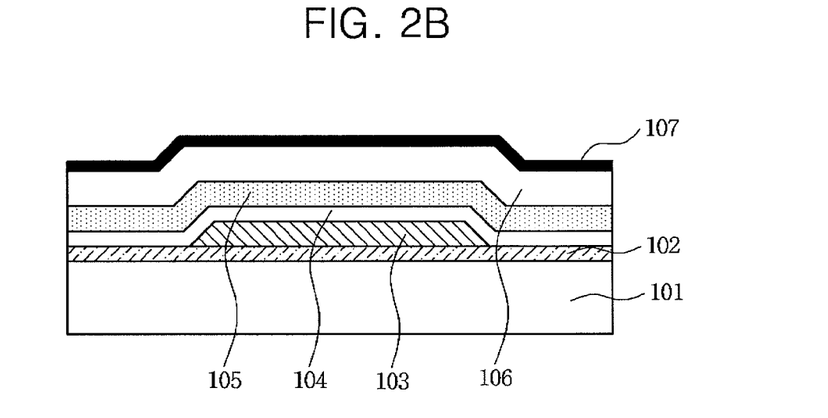

Referring to FIG. 2B, a gate insulating layer 104 may be formed on the substrate 101 having the gate electrode 103. The gate insulating layer 104 may be formed of a single layer or multiple layers of silicon oxide or silicon nitride. An amorphous silicon (a-Si) layer 105 may be formed on the gate insulating layer 104. In this case, the a-Si layer 105 may be formed using a chemical vapor deposition (CVD) process or a physical vapor deposition (PVD) process. Also, a dehydrogenation process may be performed during or after the formation of the a-Si layer 105, thereby lowering hydrogen concentration.

Thereafter, a capping layer 106 may be formed of silicon oxide or a silicon nitride on the a-Si layer 105. In this case, the capping layer 106 may be formed of a silicon nitride layer because the silicon nitride facilitates diffusion of a metal catalyst more than a silicon oxide layer.

Although FIG. 2B illustrates that the capping layer 106 is formed after forming the a-Si layer 105 on substantially an entire surface of the substrate 101, the capping layer 106 may be formed after patterning the a-Si layer 105 to form an a-Si layer pattern.

Thereafter, a metal catalyst layer 107 may be formed on the capping layer 106. In this case, the metal catalyst layer 107 may include Ni, Pd, Ti, Ag, Au, Al, Sn, Sb, Cu, Co, Mo, Tr, Ru, Rh, Cd, or Pt using a deposition apparatus, such as a sputtering apparatus. These may be used alone or in a combination thereof.

In this case, the metal catalyst layer 107 may be formed on the capping layer 106 at an areal density of about $10^{11}$ to $10^{15}$ atoms/cm$^2$.

The crystallinity of the a-Si layer 105 may depend on the concentration of the metal catalyst layer 107. When the metal catalyst layer 107 is formed at an excessively high concentration, the grain size of a poly-Si layer may be reduced, and the amount of metal catalyst remaining in the poly-Si layer may be increased to degrade the characteristics of the poly-Si layer. Conversely, when the metal catalyst layer 107 is formed at an excessively low concentration, it may be difficult not only to uniformly deposit the metal catalyst layer 107 using a current deposition apparatus, but also to form a sufficient amount of seeds (or crystal nuclei) for the crystallization of the metal catalyst layer 107.

Also, the metal catalyst layer 107 may be formed of nickel (Ni) because Ni is suited to crystallize the a-Si layer into a poly-Si layer.

Figure 2C:
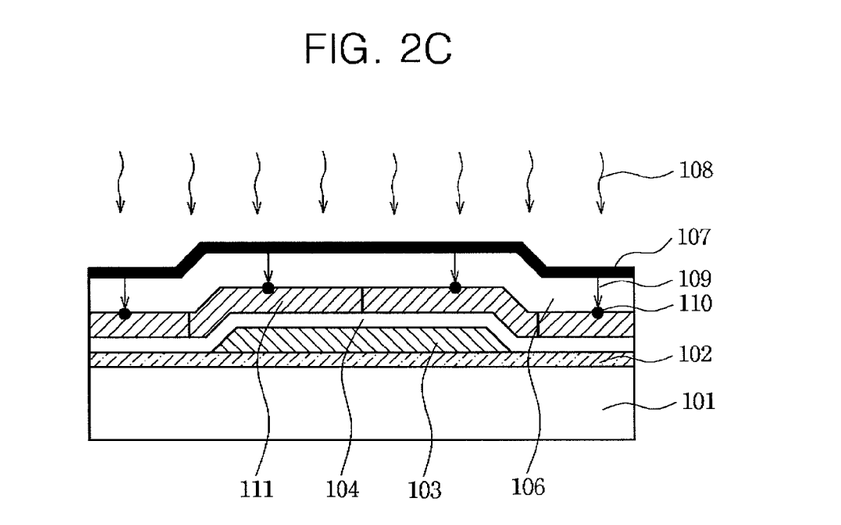

Referring to FIG. 2C, the substrate 101 may be annealed (refer to 108) so that a metal catalyst of the metal catalyst layer 107 may diffuse or permeate into the capping layer 106 (refer to 109) and move to an interface between the capping layer 106 and the a-Si layer 105 to form crystal nuclei (that is, seeds 110). Thus, the a-Si layer 105 may be crystallized into a poly-Si layer 111 from the seeds. In this case, the annealing process 108 may be a furnace process, a rapid thermal annealing (RTA) process, an ultraviolet (UV) process, a plasma process, or a laser process, which enables substantially an entire substrate 101 or both the capping layer 106 and the a-Si layer 105 to be annealed.

In this case, the annealing process 108 may be performed twice. Specifically, a first annealing process may enable the metal catalyst to move to the interface between the capping layer 106 and the a-Si layer 105 to form the seeds 110. A second annealing process may enable crystallization of the a-Si layer 105 into the poly-Si layer 111 from the seeds. In this case, the first annealing process may be performed at a temperature of about 200 to 800° C., while the second annealing process may be performed at a temperature of about 400 to 1300° C. After the first annealing process, the metal catalyst layer 107 may be removed to prevent diffusion or permeation of the metal catalyst during the second annealing process.

Accordingly, the size and uniformity of crystal grains of the poly-Si layer 111 may be determined by the number, density, and position of the seeds 110 generated at the interface between the capping layer 106 and the a-Si layer 105. In particular, the size and uniformity of the crystal grains of the poly-Si layer may depend not only on the diffusion characteristics of the metal catalyst but also the density of the metal catalyst layer 107. That is, as the density of the metal catalyst layer 107 decreases and the diffused amount of the metal catalyst contained in the capping layer 106 decreases, the grain size of the poly-Si layer may increase.

As described above, a crystallization process that includes forming a capping layer and a metal catalyst layer on an a-Si layer to control diffusion or permeation of a metal catalyst, and annealing the capping layer and the metal catalyst to crystallize the a-Si layer into a poly-Si layer with a large grain size may be referred to as super grain silicon (SGS) crystallization.

According to SGS crystallization, the remaining amount of a metal in the capping layer may be reduced so that a metal catalyst may remain on the poly-Si layer 111 at an areal density of about $10^9$ to $10^{13}$ atoms/cm$^2$. Thus, SGS crystallization may allow a TFT to have better leakage current characteristics than other crystallization methods.

Meanwhile, although it has been described above that the a-Si layer 105 is crystallized into the poly-Si layer 111 using an SGS crystallization process, non-limiting example embodiments of the invention are not limited to the SGS crystallization process. As known in the art, the SGS crystallization process may be replaced, e.g., by a solid phase crystallization (SPC) process, an excimer laser crystallization (ELC) process, a metal induced crystallization (MIC) process, or a metal induced lateral crystallization (MILC) process.

Figure 2D:
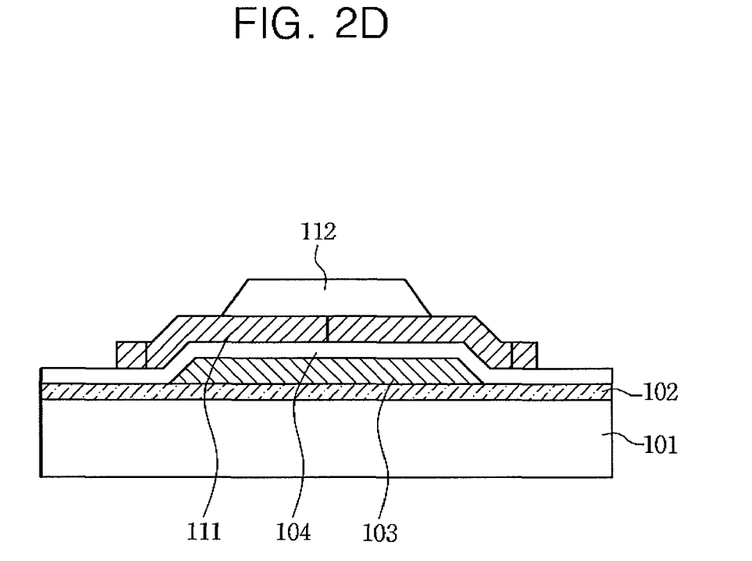

Referring to FIG. 2D, the capping layer 106 may be patterned to form an etch stopper 112. Alternatively, the capping layer 106 may be removed, and an insulating layer, such as a silicon oxide layer or a silicon nitride layer, may be formed and patterned to form the etch stopper 112.

Afterwards, the poly-Si layer 111 may be patterned to form a semiconductor layer. Meanwhile, as described above, the capping layer 106 may be formed after forming the a-Si layer 105 on substantially an entire surface of the substrate 101. Alternatively, the capping layer 106 may be formed after patterning the a-Si layer 105 to form an a-Si layer pattern. Accordingly, only in the former case, after forming the etch stopper 112, the poly-Si layer 111 should be patterned.

In this case, the capping layer 106 may be etched to form the etch stopper 112. This is because the capping layer 106, which is formed of an insulating layer, such as a silicon oxide layer or a silicon nitride layer, may be used as an insulating layer for forming the etch stopper 112 without forming an additional insulating layer. Although the capping layer 106 may contain a small amount of metal catalyst, the small amount of metal catalyst would hardly affect the TFT during subsequent processes, and thus may be disregarded. Specifically, an interface between the gate insulating layer 104 and the poly-Si layer 111 is on the opposite side of an interface which may affect the small amount of metal catalyst, i.e., between the capping layer 106 and the poly-Si layer 111, and thus the remaining metal is not likely to cause many problems.

In this case, a portion of the poly-Si layer 111 on which the etch stopper 1112 is formed may be defined as a channel region.

Meanwhile, as described above, when the a-Si layer 105 is crystallized into the poly-Si layer 111 using an SPC process, an ELC process, an MIC process, or an MILC process, a process of forming the capping layer 106 is not required. Accordingly, an insulating layer, such as a silicon oxide layer or a silicon nitride layer may be formed on the poly-Si layer 111 and patterned to form the etch stopper 112.

Figure 2E:
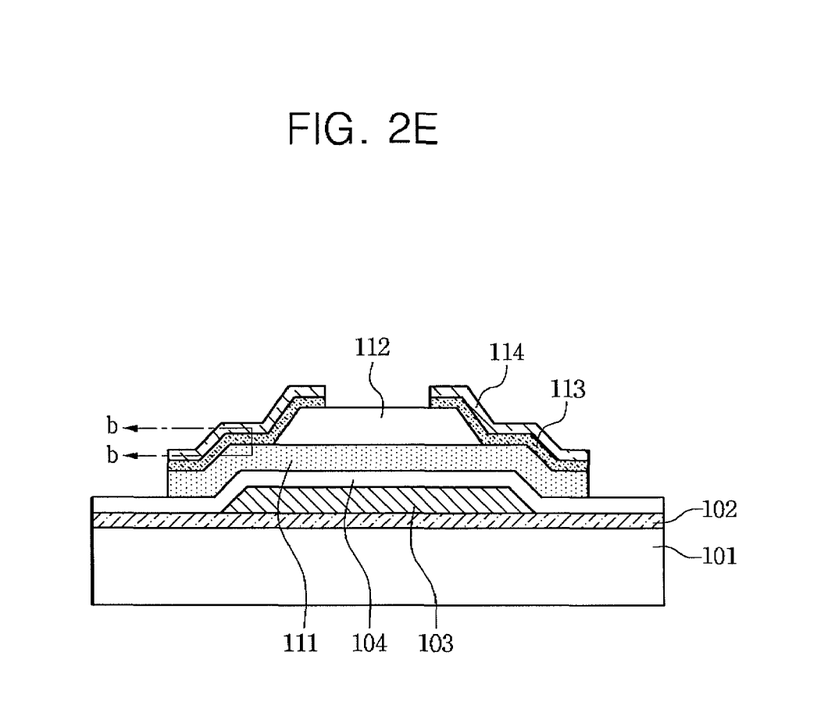

Referring to FIG. 2E, a barrier material (not shown) may be formed on the substrate 101 having the etch stopper 112, and a heavily doped Si material (not shown) may be formed on the barrier material.

As will be described later, the barrier material may be formed of a material having a low effective density, specifically, an undoped a-Si material.

The undoped a-Si material may be formed to obtain the same effects as the above-described lightly doped drain (LDD) regions, that is, to control a leakage current. The undoped a-Si material may be formed using a known layer forming method, for example, a low-pressure chemical vapor deposition (LPCVD) process, an atmospheric pressure CVD (APCVD) process, a plasma-enhanced CVD (PECVD) process, a sputtering process, or a vacuum evaporation process. However, the present invention is not limited to the above-described methods of forming the undoped a-Si material.

Conventionally, an impurity doping process for forming an LDD region had to be performed to control a leakage current.

However, since it is difficult to control the impurity doping process, the uniformity of the LDD region may be degraded and additional photolithography and etching processes and doping processes may be needed.

However, according to non-limiting example embodiments of the present invention, a layer capable of controlling the leakage current in the same way as the LDD region may be formed using standard layer-forming processes.

Referring to FIG. 2E, the barrier material and the heavily doped Si material formed on the barrier material may be patterned, thereby forming a barrier layer 113 and a heavily doped Si layer 114.

In this case, the barrier layer 113 may correspond to a layer capable of controlling a leakage current in the same way as an LDD region.

Also, the heavily doped Si layer 114 may be an ohmic contact layer to define source and drain regions, which is known to those skilled in the art and thus, a detailed description thereof will be omitted here.

Meanwhile, the etch stopper 112 may function to prevent the poly-Si layer 111, particularly, the channel region, from being etched or damaged during the patterning of the barrier material and the heavily doped Si material. The process of forming the source and drain regions by etching the heavily doped Si layer 114 using the etch stopper 112 may be referred to as an etch stopper (E/S) etching process.

That is, the barrier material and the ohmic contact material may be formed on substantially an entire surface of the substrate 101 having the etch stopper 112 and etched at one time using the etch stopper 112 as a mask, thereby forming the barrier layer 113 and the ohmic contact layer 114.

Figure 2F:
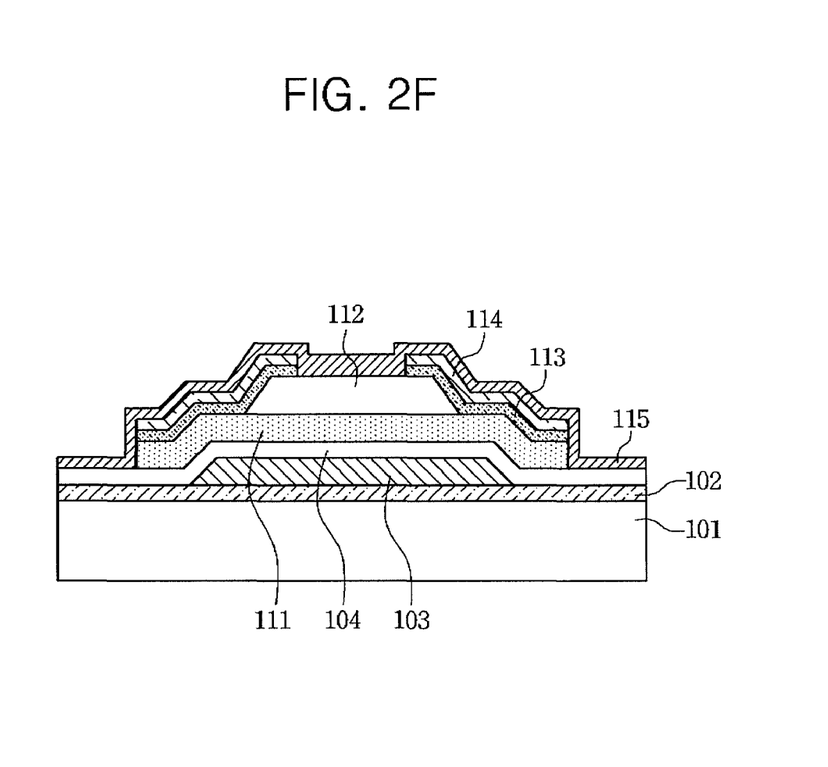

Referring to FIG. 2F, an interlayer 115, which may be an insulating layer, may be formed on substantially an entire surface of the substrate 101 having the heavily doped Si layer 114, which is the ohmic contact layer, using the above-described known layer-forming process.

The interlayer 115 may be formed of an organic layer or an inorganic layer. The organic layer may include polyacrylate resins, epoxy resins, phenolic resins, polyamide resins, polyimide resins, unsaturated polyester resins, poly(phenylenether) resins, poly(phenylenesulfide) resins, or benzocyclobutene (BCB). These may be used alone or in a combination thereof.

The inorganic layer may include a silicon oxide layer, a silicon nitride layer, or a silicon oxynitride layer. These may be used alone or in a combination. However, non-limiting example embodiments of the invention are not limited to the above-described materials of the interlayer 115.

Figure 2G:
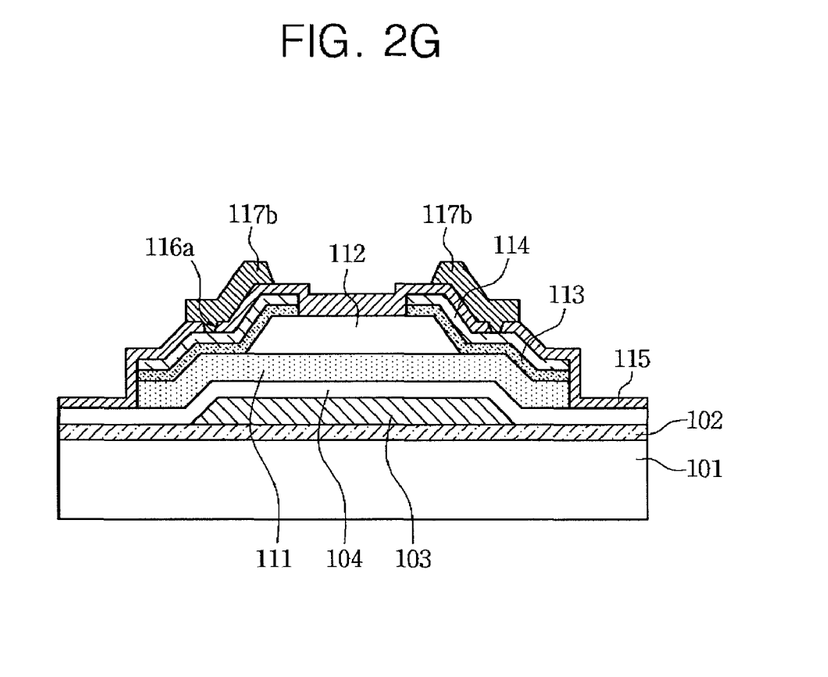

Referring to FIG. 2G, predetermined regions of the interlayer 120, which may be an insulating layer, may be removed to form contact holes 116a and 116b in the interlayer 120.

The contact holes 116a and 116b may function to expose the predetermined regions of the heavily doped Si layer 114, which define the source and drain regions. Source and drain electrodes 117a and 117b may be formed to be electrically connected to the heavily doped Si layer 114 through the contact holes 116a and 116b, respectively.

In this case, the source and drain electrodes 117a and 117b may be formed using a single layer including Mo, W, MoW, AlNd, Ti, Al, an Al alloy, Ag, or a Ag alloy. These may be used alone or in a combination. Alternatively, in order to reduce interconnection resistance, the source and drain electrodes 117a and 117b may be formed using a double or multiple layer formed of low-resistance materials. The double layer may include Mo, Al, or Ag. These may be used alone or in a combination. The multiple layer may include one stacked structure. The stacked structure may be Mo/Al/Mo, MoW/Al—Nd/MoW, Ti/Al/Ti, Mo/Ag/Mo, or Mo/Ag-alloy/Mo.

As a result, the fabrication of a TFT according to a non-limiting example embodiment of the invention may be completed.

Therefore, when the bottom-gate-type TFT is fabricated using the processes described with reference to FIGS. 2A through 2G, the semiconductor layer may be formed of the poly-Si layer 111 so that the bottom-gate-type TFT can have as high an on/off speed as the top-gate-type TFT and high electron mobility.

In addition, since the a-Si layer 105 is crystallized using an SGS crystallization process, an interface between the poly-Si layer 111 and the gate insulating layer 104 may be neither exposed nor contaminated. Also, the poly-Si layer 111 having a large grain size may be used as a channel region due to the SGS crystallization process so that a TFT having good leakage current characteristics and high electron mobility can be fabricated using standard processes.

Furthermore, the undoped a-Si layer 105 may be formed using a standard layer-forming process between the poly-Si layer 111 of the semiconductor layer and the heavily doped Si layer for defining the source and drain regions. Thus, a layer capable of controlling a leakage current in the same way as an LDD region may be formed using standard processes.

Figure 3A:
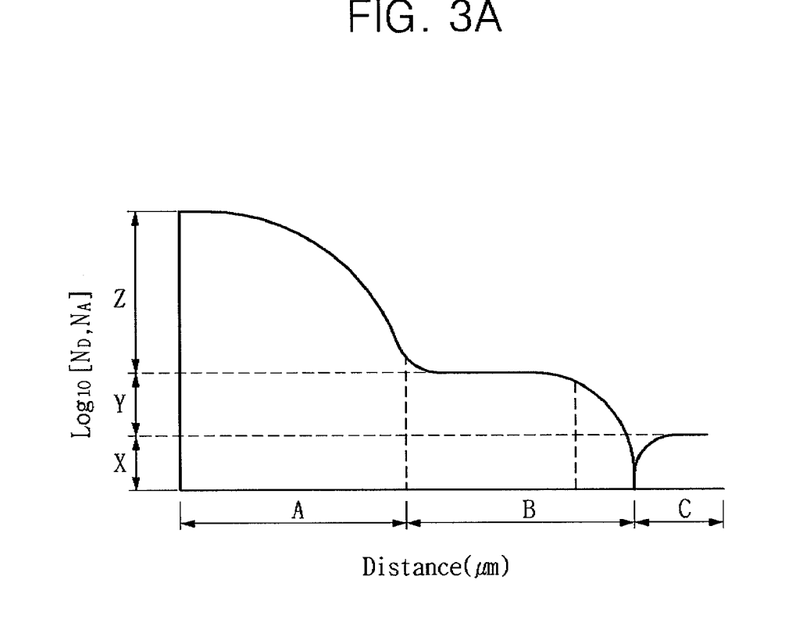
FIG. 3A is a phase diagram of the effective density of a region a-a of FIG. 1A.

FIG. 3A is a phase diagram of the effective density of a region a-a of FIG. 1A, which shows the effective density of a typical TFT including an LDD region.

A typical TFT includes an LDD region to control an off-current. In the TFT having the LDD region, and the LDD region may disperse an electric field concentrated on a drain region to control an off-current state.

In FIG. 3A, reference character A denotes source and drain regions, B denotes the LDD region, and C denotes a channel region. Also, reference character X denotes the effective density of the channel region, Y denotes the effective density of the LDD region, and Z denotes the effective density of the source and drain regions.

Referring to FIG. 3A, by forming the LDD region, an effective density may be reduced as denoted by the domain Y. As a result, an electric field concentrated on the drain region may be dispersed, thereby controlling an off-current state.

Figure 3B:
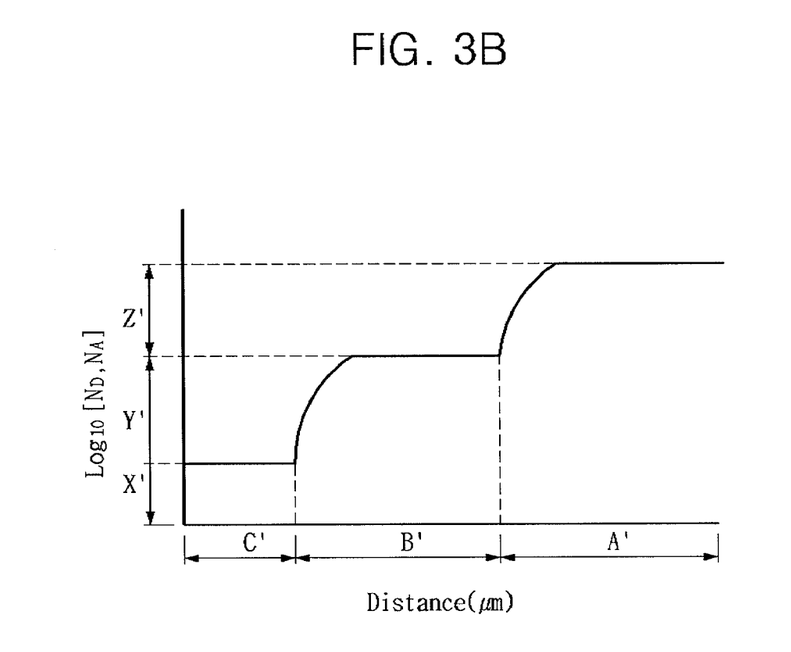
FIG. 3B is a phase diagram of the effective density of a region b-b of FIG. 2E.

FIG. 3B is a phase diagram of the effective density of a region b-b of FIG. 2E, which shows the effective density of a TFT including an undoped a-Si layer according to a non-limiting example embodiment of the present invention.

In FIG. 3B, reference character A' denotes source and drain regions, B' denotes an undoped a-Si layer region, and C' denotes a channel region. Also, reference character X' denotes the effective density of the channel region, Y' denotes the effective density of the undoped a-Si layer region, and Z' denotes the effective density of source and drain regions.

Referring to FIG. 3B, by forming the undoped a-Si layer region, an effective density may be reduced as denoted by the domain Y'. Thus, an electric field concentrated on the drain region may be dispersed in the same way as the LDD region, thereby controlling an off-current state.

According to the present invention as described above, a bottom-gate-type TFT may be fabricated using a semiconductor layer formed of a poly-Si layer so that the bottom-gate-type TFT may have as high an on/off speed as a top-gate-type TFT and high electron mobility.

Also, an a-Si layer may be crystallized using an SGS crystallization process so that a poly-Si layer having a large crystal grain size may be used as a channel region. Therefore, a TFT having good leakage current characteristics and high electron mobility may be fabricated using a simple process.

Furthermore, a layer capable of controlling a leakage current in the same way as an LDD region may be formed using a simple process.

Although the present invention has been described with reference to certain non-limiting example embodiments thereof, it will be understood by those skilled in the art that a variety of modifications and variations may be made without departing from the spirit or scope in the appended claims, and their equivalents.

What is claimed is:

1. A thin film transistor (TFT) comprising:
    a substrate;
    a gate electrode disposed over the substrate;
    a gate insulating layer disposed over the gate electrode;
    a semiconductor layer disposed over the gate insulating layer, the semiconductor layer comprising a polycrystalline silicon (poly-Si) layer;
    an ohmic contact layer disposed over a predetermined region of the semiconductor layer;
    an insulating interlayer disposed over substantially an entire surface of the substrate including the ohmic contact layer; and
    source and drain electrodes electrically connected to the ohmic contact layer through contact holes formed in the interlayer,
    wherein a barrier layer is interposed between the semiconductor layer and the ohmic contact layer.

2. The TFT of claim 1, wherein the barrier layer includes an undoped amorphous silicon (a-Si) layer.

3. The TFT of claim 1, wherein the ohmic contact layer comprises heavily doped silicon.

4. The TFT of claim 1, further comprising an etch stopper disposed over a predetermined region of the semiconductor layer to define a channel region.

5. The TFT of claim 4, wherein the etch stopper is a portion of a capping layer.

6. The TFT of claim 5, wherein the capping layer is a silicon oxide layer or a silicon nitride layer.

7. The TFT of claim 1, wherein a metal catalyst remains in the poly-Si layer at an areal density of about $10^9$ to $10^{13}$ atoms/cm$^2$.

8. The TFT of claim 1, wherein the barrier layer is formed to correspond to the ohmic contact layer.

9. A method of fabricating a thin film transistor (TFT), comprising:
    forming a gate electrode on a substrate;
    forming a gate insulating layer on the gate electrode;
    forming a semiconductor layer comprising an amorphous silicon (a-Si) on the gate insulating layer;
    crystallizing at least a portion of the a-Si;
    forming a barrier layer and an ohmic contact layer on a predetermined region of the semiconductor layer;
    forming an interlayer on substantially an entire surface of the substrate having the ohmic contact layer and forming contact holes exposing predetermined regions of the ohmic contact layer in the interlayer; and
    forming source and drain electrodes through the contact holes of the interlayer to be electrically connected to the exposed ohmic contact layer.

10. The method of claim 9, wherein crystallizing at least a portion of the a-Si forms a polycrystalline silicon (poly-Si) layer.

11. The method of claim 10, wherein crystallizing at least a portion the a-Si layer into the poly-Si layer comprises:
    forming a capping layer on the a-Si layer;
    forming a metal catalyst layer on the capping layer; and
    annealing the substrate to crystallize at least a portion of the a-Si layer into the poly-Si layer.

12. The method of claim 11, further comprising patterning the capping layer to form an etch stopper after crystallizing at least a portion of the a-Si layer into the poly-Si layer.

13. The method of claim 10, further comprising forming an insulating layer on the poly-Si layer and patterning the insulating layer to form an etch stopper after forming the poly-Si layer.

14. The method of claim 12, wherein forming the barrier layer and the ohmic contact layer on the predetermined region of the poly-Si layer comprises:
    forming a barrier material and an ohmic contact material on substantially an entire surface of the substrate having the etch stopper; and
    etching the substrate having the barrier material and the ohmic contact material at one time using the etch stopper as a mask.

15. The method of claim 13, wherein forming the barrier layer and the ohmic contact layer on the predetermined region of the poly-Si layer comprises:
    forming a barrier material and an ohmic contact material on substantially an entire surface of the substrate having the etch stopper; and
    etching the substrate having the barrier material and the ohmic contact material at one time using the etch stopper as a mask.

16. The method of claim 9, wherein the barrier layer includes undoped a-Si.

17. The method of claim 14, wherein the barrier layer is formed using a low-pressure chemical vapor deposition (LPCVD) process, an atmospheric pressure CVD (APCVD) process, a plasma-enhanced CVD (PECVD) process, a sputtering process, or a vacuum evaporation process.

18. The method of claim 9, wherein the ohmic contact layer includes heavily doped silicon.

19. The method of claim 9, wherein a metal catalyst remains in the poly-Si layer at an areal density of about $10^9$ to $10^{13}$ atoms/cm$^2$.

20. A thin film transistor (TFT) comprising:
    a substrate;
    a gate electrode formed over the substrate;
    a gate insulating layer formed over the gate electrode;
    a crystalline semiconductor layer formed over the gate insulating layer;
    a barrier layer formed over the semiconductor layer;
    an ohmic contact layer formed over the barrier layer; and
    source and drain electrodes electrically connected to the ohmic contact layer through contact holes formed in an interlayer;
    wherein the semiconductor layer comprises a polycrystalline silicon.

* * * * *

UNITED STATES PATENT AND TRADEMARK OFFICE
CERTIFICATE OF CORRECTION

| | |
|---|---|
| PATENT NO. | : 8,288,216 B2 |
| APPLICATION NO. | : 12/753732 |
| DATED | : October 16, 2012 |
| INVENTOR(S) | : Kang et al. |

It is certified that error appears in the above-identified patent and that said Letters Patent is hereby corrected as shown below:

In the Specifications

In column 5 at line 50, after "also" insert --on--.

In column 7 at line 40, change "ph enolic" to --phenolic--.

In column 8 at line 30, before "the" delete "and".

In the Claims

In column 9 at line 34, in Claim 4, change "predetennined" to --predetermined--.

In column 9 at line 51, in Claim 9, change "a-Si ;" to --a-Si;--.

In column 10 at line 5, in Claim 11, after "portion" insert --of--.

Page 1 of 1

Signed and Sealed this
Sixteenth Day of July, 2013

Teresa Stanek Rea
*Acting Director of the United States Patent and Trademark Office*